(12) United States Patent
Mengel et al.

(10) Patent No.: US 9,385,111 B2
(45) Date of Patent: Jul. 5, 2016

(54) ELECTRONIC COMPONENT WITH ELECTRONIC CHIP BETWEEN REDISTRIBUTION STRUCTURE AND MOUNTING STRUCTURE

(71) Applicant: Infineon Technologies Austria AG, Villach (AT)

(72) Inventors: Manfred Mengel, Bad Abbach (DE); Edward Fürgut, Dasing (DE); Ralf Otremba, Kaufbeuren (DE); Jürgen Högerl, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/087,070

(22) Filed: Nov. 22, 2013

(65) Prior Publication Data

US 2015/0145111 A1    May 28, 2015

(51) Int. Cl.
| | | |
|---|---|---|
| *H01L 23/12* | (2006.01) | |
| *H01L 25/16* | (2006.01) | |
| *H01L 21/56* | (2006.01) | |
| *H01L 25/00* | (2006.01) | |
| *H01L 25/07* | (2006.01) | |
| *H01L 23/31* | (2006.01) | |
| *H01L 23/495* | (2006.01) | |

(52) U.S. Cl.
CPC .............. *H01L 25/165* (2013.01); *H01L 21/56* (2013.01); *H01L 23/3107* (2013.01); *H01L 23/49524* (2013.01); *H01L 23/49531* (2013.01); *H01L 23/49562* (2013.01); *H01L 23/49575* (2013.01); *H01L 25/072* (2013.01); *H01L 25/50* (2013.01); *H01L 2224/48247* (2013.01); *H01L 2224/4903* (2013.01); *H01L 2924/13055* (2013.01)

(58) Field of Classification Search
CPC ....... H01L 25/165; H01L 21/56; H01L 25/50; H01L 25/07223; H01L 25/3107
USPC .......................................................... 257/700
See application file for complete search history.

(56) References Cited

U.S. PATENT DOCUMENTS

| | | | | |
|---|---|---|---|---|
| 6,836,006 B2* | 12/2004 | Muto | ...................... | H01L 24/73 257/686 |
| 8,836,080 B2* | 9/2014 | Hori | ........................ | H01L 28/40 257/532 |
| 8,907,477 B2* | 12/2014 | Yamada | ........................ | 257/737 |
| 9,059,009 B2* | 6/2015 | Horio | ........................ | H01L 25/18 |
| 2004/0061206 A1 | 4/2004 | Son et al. | | |

FOREIGN PATENT DOCUMENTS

DE       103 31 857 B4    1/2008

* cited by examiner

*Primary Examiner* — Luan C Thai

(57) ABSTRACT

An electronic component which comprises an electrically conductive mounting structure, an electronic chip on the mounting structure, an electrically conductive redistribution structure on the electronic chip, and a periphery connection structure electrically coupled to the redistribution structure and being configured for connecting the electronic component to an electronic periphery, wherein at least one of the electrically conductive mounting structure and the electrically conductive redistribution structure comprises electrically conductive inserts in an electrically insulating matrix.

26 Claims, 8 Drawing Sheets

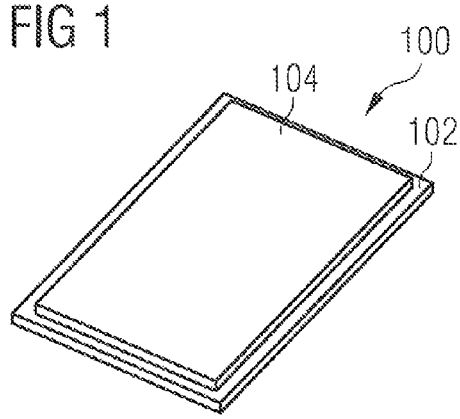
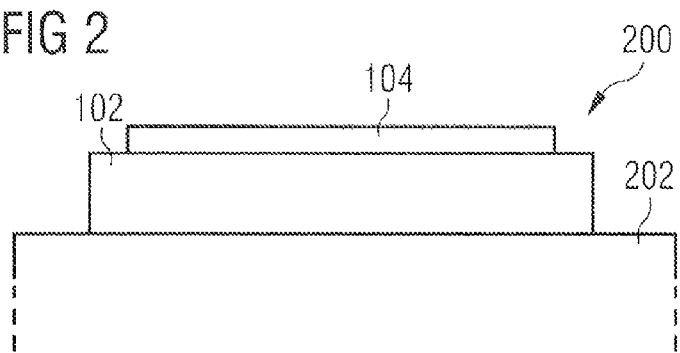
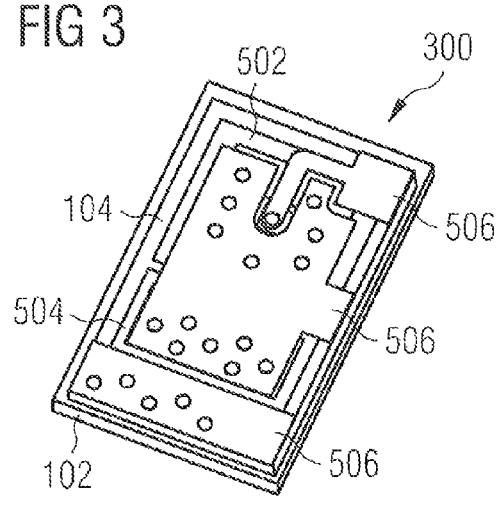
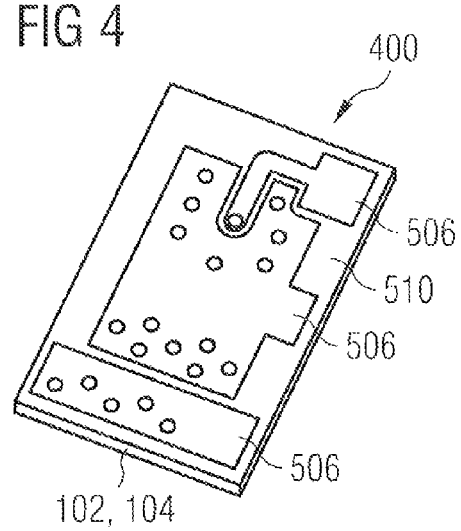

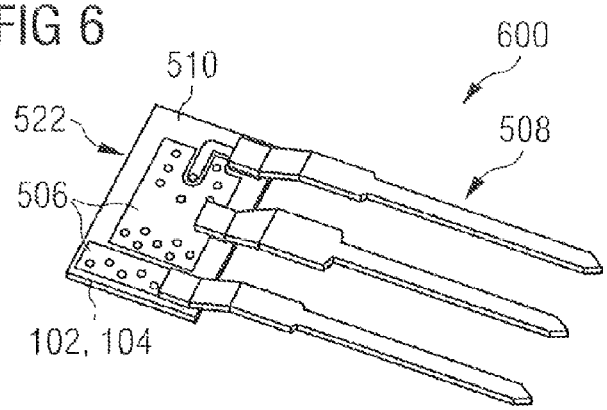
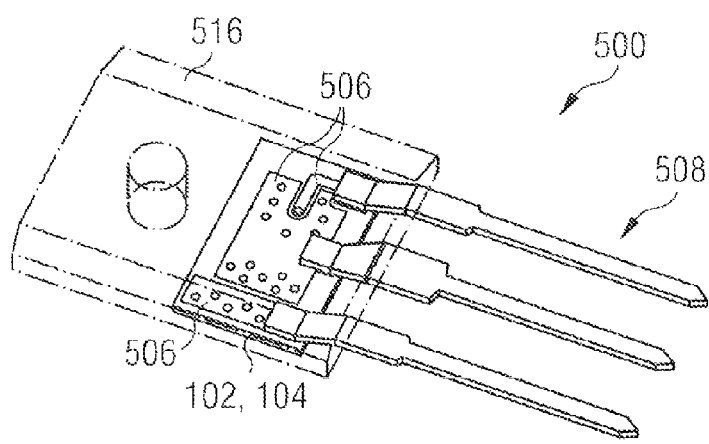
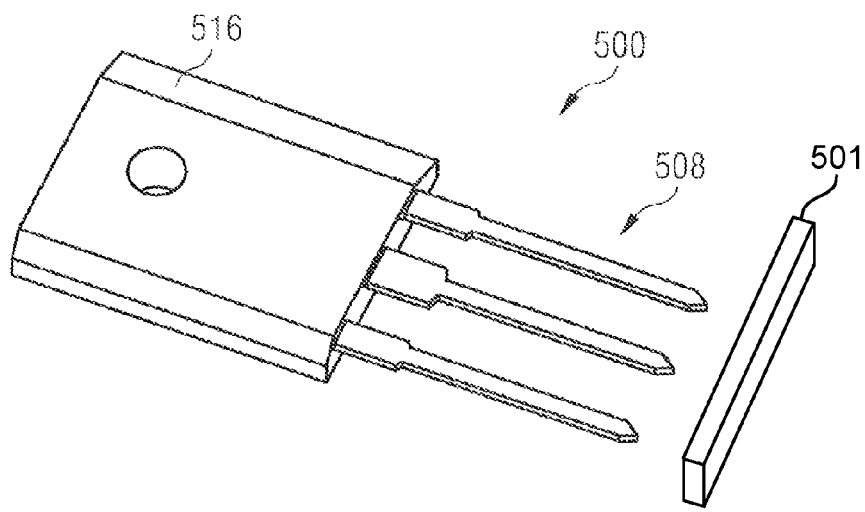

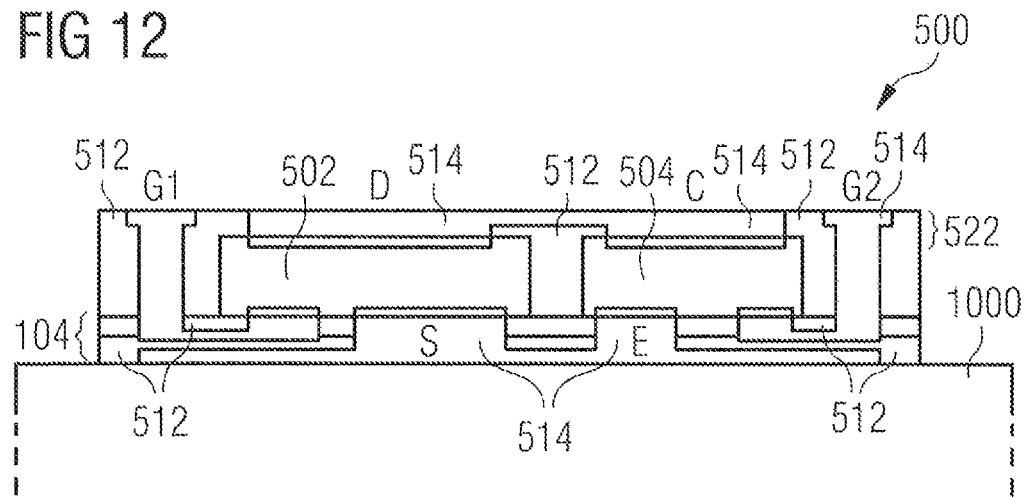
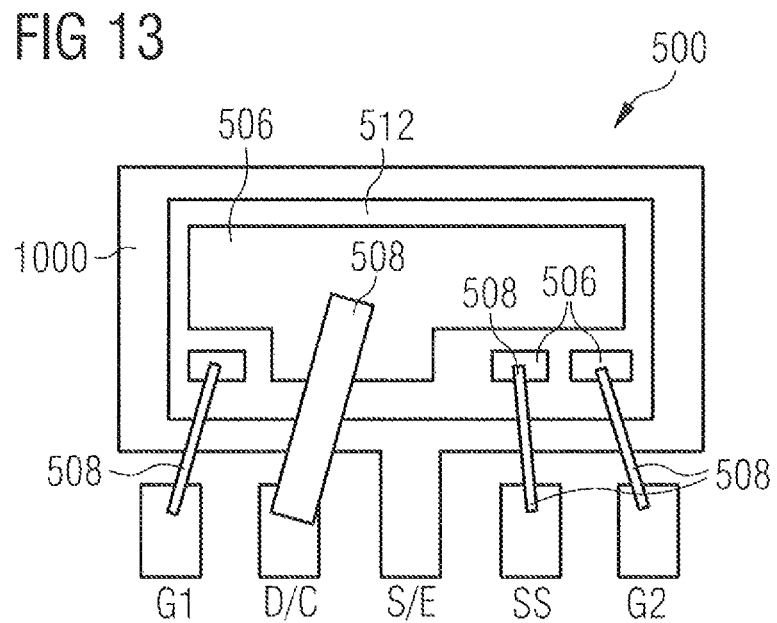

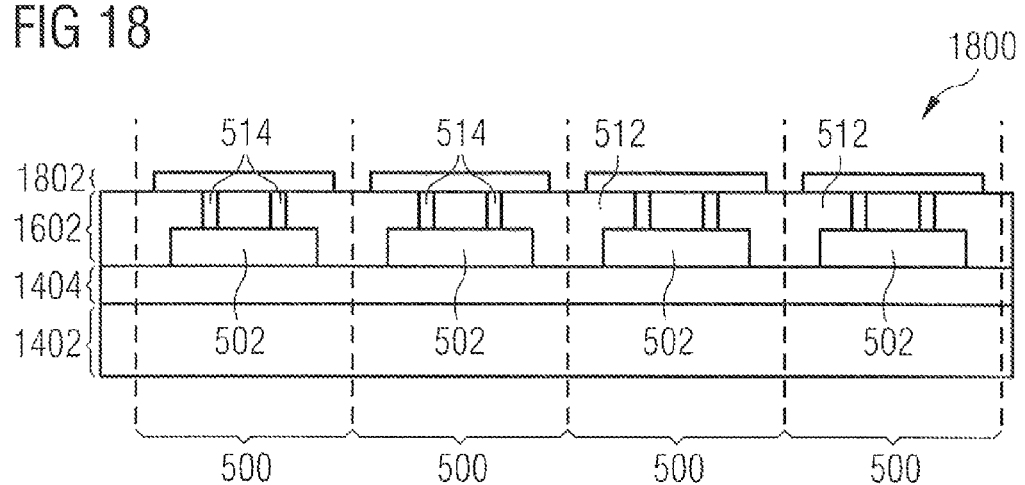
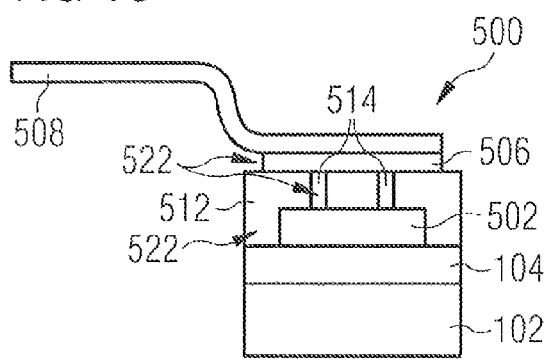
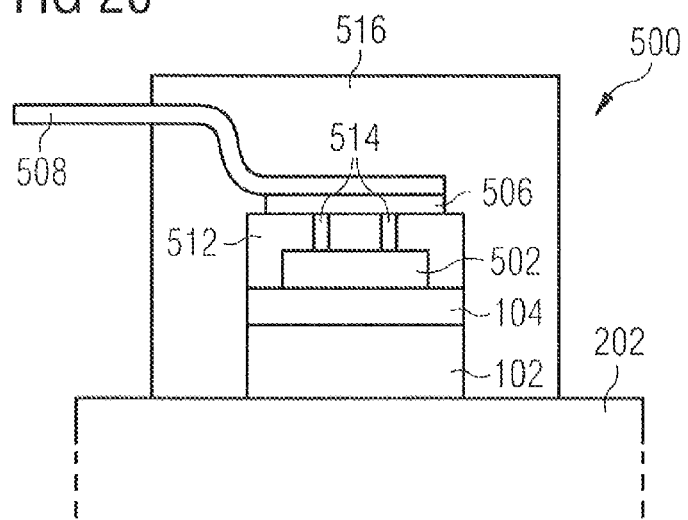

ELECTRONIC COMPONENT WITH ELECTRONIC CHIP BETWEEN REDISTRIBUTION STRUCTURE AND MOUNTING STRUCTURE

BACKGROUND

1. Technical Field

Various embodiments relate generally to an electronic component, a method of manufacturing an electronic component, and an arrangement.

2. Description of the Related Art

Conventional packages, such as mold structures, for electronic chips have evolved to a level where the package no longer significantly impedes the performance of the electronic chips. Such electronic chips can be mounted on a leadframe, and an upper main surface of the electronic chips is connected to the leadframe by a bond wire.

A conventional electronic chip mounted on a chip carrier such as a lead frame, electrically connected by a bond wire extending from the chip to the chip carrier, and molded within a package may suffer from its thermal insulation within the package. Furthermore, such a conventional approach can reach its limits when complex electronic circuits shall be established.

SUMMARY

There may be a need to provide a possibility to manufacture electronic chips with a simple processing architecture and with a high reliability.

According to an exemplary embodiment, an electronic component is provided which comprises an electrically conductive mounting structure, an electronic chip on the mounting structure, an electrically conductive redistribution structure on the electronic chip, and a periphery connection structure electrically coupled to the redistribution structure and being configured for connecting the electronic component to an electronic periphery.

According to another exemplary embodiment, a method of manufacturing an electronic component is provided which comprises mounting an electronic chip on an electrically conductive mounting structure, arranging an electrically conductive redistribution structure on the electronic chip, electrically coupling a periphery connection structure to the redistribution structure and configuring the periphery connection structure for connecting the electronic component to an electronic periphery, and providing the electrically conductive mounting structure and/or the electrically conductive redistribution structure with electrically conductive inserts in an electrically insulating matrix.

According to yet another exemplary embodiment, an arrangement is provided which comprises a plurality of interconnected electrically conductive mounting structures, a plurality of electronic chips, each of which being mounted on an assigned one of the mounting structures, and a plurality of interconnected electrically conductive redistribution structures, each of which being mounted on an assigned one of the electronic chips, wherein the electrically conductive mounting structures and/or the electrically conductive redistribution structures comprise electrically conductive inserts in an electrically insulating matrix.

An exemplary embodiment has the advantage that one or more electronic chips can be mounted on both opposing main surfaces thereof to an electric contact structure in the form of a mounting structure (in particular at a bottom side of the respective electronic chip) and a redistribution structure (in particular at a top side of the respective electronic chip). Such an architecture makes it possible that the respective electronic chip is electrically pre-connected at two opposing main surfaces thereof to form a multi-purpose submodule manufacturable in a batch process. On one or both main surfaces, a chip wiring system of electrically conductive inserts in a dielectric matrix may be provided which provides a high freedom of designing application-specific electric connections for the electronic chip. Sandwiching the electronic chip or chips, directly or indirectly, between the mounting structure and the redistribution structure also allows to mechanically protect the sensitive electronic chip. On top of the redistribution structure, a mechanical and electrical coupling to the electronic periphery, such as a connected electronic device, may be accomplished in a simple way by connecting the periphery connection structure thereto. The double sided electric coupling of the electronic chip via the mounting structure on one side and the redistribution structure on the other side also renders the architecture particularly appropriate for high power applications in which a vertical current flow and therefore a contact of the electronic chip on both opposing main surfaces may be desired. Such a coupling between the electronic chip and the electronic periphery and/ or between various electronic chips of the electronic component may be performed in a highly flexible way by the mounting structure and/or the redistribution structure with its matrix-insert-bodies, thereby allowing even complex configurations of electrically conductive and electrically insulating sections to flexibly connect or disconnect chip pads to one another. An additional advantage of exemplary embodiments is that this architecture is compatible with standard packaging concepts so that no adaptation of the electronic periphery is required. The architecture according to exemplary embodiments is moreover highly appropriate for a batch processing of multiple electronic chips at the same time, because the various constituents of the electronic components may form part of a stacked arrangement of constituents which can simply be arranged on top of each other so that an efficient processing of many electronic components is possible on an industrial scale in a parallel common manufacturing procedure. A corresponding submodule of electronic chip with pre-mountable mounting structure and redistribution structure may also promote a proper removal of heat generated by the electronic chip during operation of the electronic component from both of its main surfaces away from the chip.

DESCRIPTION OF FURTHER EXEMPLARY EMBODIMENTS

In the following, further exemplary embodiments of the electronic component, the method of manufacturing an electronic component, and the arrangement will be explained.

A gist of an exemplary embodiment is a synergetic combination of leadframe technology (the periphery connection structure may be configured in leadframe technology) with chip embedding technology (as provided by a double sided planar contacting of an electronic chip or multiple chips by redistribution structure/mounting structure). In other words, an interior of the provided electronic component may comprise a pre-mounted embedded electronic chip or a plurality thereof including a redistribution structure appropriate even for realizing sophisticated wiring concepts, whereas an exterior of the provided electronic component may appear visually as a conventional package or standard housing which is therefore compatible with a conventional electronic periphery. This ensures compatibility with existing electronic systems, while allowing for a better temperature stability, better heat removal properties, the opportunity to combine multiple electronic chips internally to thereby provide a module, and the possibility to obtain a high electrical performance.

In an embodiment of the electronic component, the electrically conductive mounting structure and/or the electrically conductive redistribution structure comprise or comprises electrically conductive inserts in an electrically insulating matrix.

In an embodiment, the electrically conductive mounting structure and/or the electrically conductive redistribution structure is/are shaped as a substantially planar structure completely covering a respective main surface of the electronic chip. Thus, the full main surface(s) of the electronic chip may be used for bonding which provides a robust mechanical as well as electric connection and a proper thermal coupling. In particular by a double sided connection, a submodule is provided which also allows a free design of even complicated contact pad connection characteristics.

In an embodiment, the electrically conductive mounting structure and/or the electrically conductive redistribution structure is configured as a multi-layer structure (i.e. a structure of two or more stacked layers, which may for instance be connected to one another by laminating or depositing). Therefore, within one (top or bottom) or two (top and bottom) such multi-layer structures, even more than one connection wiring may be formed, which may be aligned in horizontal and/or vertical direction, and which may be selectively electrically coupled to one another or decoupled from one another. The layers may be dielectric layers (constituting the matrix) having insulated or interconnected holes or recesses filled with electrically conductive material (constituting the inserts).

In an embodiment, the redistribution structure and/or the mounting structure comprises a patterned redistribution layer and an intermediate structure arranged between the electronic chip and the redistribution layer. The intermediate structure may comprise the electrically insulating matrix and the electrically conductive inserts in the matrix for electrically coupling a (for instance top) contact of the electronic chip with the redistribution layer.

In an embodiment, the method correspondingly comprises forming such an intermediate structure between the electronic chip and the redistribution layer. Such an intermediate structure which may be formed by electrically conductive vias embedded in a dielectric matrix, for instance of plastic material, might refine the capabilities of designing even complex circuitries for connecting one or more electronic chips between mounting structure and redistribution structure via the intermediate structure. With the intermediate structure, different pads of the electronic chip and/or different pads of different electronic chips of the electronic component may be selectively coupled to one another or decoupled from one another.

In an embodiment, the matrix comprises a mold and/or a laminate. In a scenario in which the matrix is molded, it can be formed by a molding technology starting from a liquid precursor which is subsequently hardened. In such a molded matrix, one or more through-holes may be formed by laser drilling, lithography and etching, etc., in order to define the inserts. Using a laminate allows to use a solid body which simply has to be placed on the electronic chip for mounting.

In an embodiment, different ones of the electrically conductive inserts are electrically coupled to different ones of contact pads of the electronic chip, wherein the matrix electrically decouples the different contact pads from one another. Thus, the arrangement of electrically conductive inserts in a dielectric matrix allows the constitution of any desired electric intra-chip connections.

Additionally or alternatively, the electronic component may comprise a further electronic chip, wherein at least one of the electrically conductive inserts is electrically coupled to the electronic chip, and at least one other of the electrically conductive inserts is electrically coupled to the further electronic chip. Therefore, the arrangement of the electrically conductive inserts in the dielectric matrix flexibly allows any desired formation of specific electric connections between the contact pads of different electronic chips, thereby establishing an inter-chip coupling. The electronic chip in combination with the further electronic chip (and optionally even more electronic chips) may be combined in the same electronic component. It is also possible that multiple electronic components each comprising one or more electronic chips are combined by being connected to one another within a common housing or casing, for instance by mounting them on a common substrate such as a leadframe or a printed circuit board. Thus, even modules with extensive functionality may be formed. It is for example possible that the electronic component comprises a signal section for processing signals and for exchanging signals with an electronic periphery and additionally comprises a power section to provide an electronic power function.

In an embodiment, the inserts comprise at least one via filled with an electrically conductive material. For instance, the matrix may be formed as a sheet or plate-like body with vertically extending through-holes which may be filled with metal or other electrically conductive material to form a vertical via connection structure. Alternatively, it is also possible to form the inserts by electrically conductive sections which are in direct contact to one another and which are formed in and/or between adjacent dielectric layers constituting the matrix.

In an embodiment, the electronic component further comprises an encapsulant at least encapsulating the electronic chip, the redistribution structure, the mounting structure and part of the periphery connection structure. In an embodiment, the method correspondingly comprises forming an encapsulant at least encapsulating the electronic chip, the redistribution structure, the mounting structure and part of the periphery connection structure. Accordingly (on batch level), the arrangement may further comprise an encapsulant at least encapsulating the electronic chips, the redistribution structures, the mounting structures and part of the periphery connection structures. The encapsulant may be made of a thermally conductive material, to thereby contribute to the heat removal from the electronic chip during operation of the electronic component. Such an encapsulant may be formed for instance by molding, more particularly by applying a liquid precursor onto the elements to be encapsulated, and by subsequently hardening. By taking this measure, it is possible to rigidly mechanically connect the individual constituents of the electronic device to one another while also allowing to select the material of the encapsulant to contribute to a proper heat dissipation to form the electronic chip during operation of the electronic component. In one embodiment, the encapsulating may be performed as a batch process, i.e. before singularizing electronic components from a commonly manufactured arrangement, but it is alternatively also possible to perform the encapsulation after a singularization of the arrangement into various sections each then being encapsulated by the encapsulant to thereby produce packaged electronic components. Thus, the encapsulating procedure is properly implementable in a batch process, but may also be flexibly performed on single electronic component basis.

In an embodiment, part of the periphery connection structure and optionally part of a thermal interface structure (which may optionally be formed or attached at an exterior surface of the mounting structure) extends or protrudes beyond the encapsulant to maintain a surface exposed to an environment. Therefore, the electrically insulating encapsulant may hermetically surround electronic chips, mounting structure and redistribution structure in order to safely electrically decouple the electrically conductive sections in an interior of the electronic component from an environment. This also ensures a high reliability against undesired creeping currents from propagating into the interior of the electronic component. At the same time, the thermal interface structure may remain at least partly outside of the encapsulant so as to ensure a proper dissipation of heat generated by the electronic chip during operation of the electronic component, which is of significant importance in particular for power semiconductor devices. The thermal interface structure may also serve as an electrically insulating barrier against creeping currents from outside of the electronic component. By arranging only a part of the periphery connection structure outside the encapsulant, a proper connection of the remaining encapsulated other part of the periphery connection structure to the redistribution structure is enabled, while simultaneously providing a mechanical and electrical adapter between the electronic component and the electronic periphery.

In an embodiment, the electronic component comprises an electrically conductive carrier structure, in particular a leadframe, on which the electrically conductive mounting structure is arranged (see for instance the embodiments shown in FIG. 10 to FIG. 13; however, also other embodiments such as the embodiments of FIG. 1 to FIG. 9 may comprise an electrically conductive carrier structure such as a leadframe on which the mounting structure may be mounted). In such an embodiment, the submodule of mounting structure, electronic chip(s) and redistribution structure, optionally including periphery connection structure, may be mounted directly onto the carrier structure in an electrically conductive way. No external electric isolation needs to be present at the mounting structure in this embodiment.

In another embodiment, the electronic component further comprises at least one electrically insulating and thermally conductive thermal interface structure. In one embodiment, the electrically conductive mounting structure is arranged on the thermal interface structure (i.e. particularly at a bottom of the electronic component, see for instance the embodiment shown in FIG. 1 to FIG. 8). In another embodiment, such an electrically insulating and thermally conductive thermal interface structure may be arranged on top of the redistribution structure or even on top of the periphery connection structure (i.e. particularly on top of the electronic component). It is also possible that both a bottom and a top of the electronic component are provided with a corresponding electrically insulating and thermally conductive thermal interface structure to thereby provide a double sided cooling. Hence, it is possible to further improve the heat dissipation properties of the electronic component. Both external surfaces of such electrically insulating and thermally conductive thermal interface structures may be exposed to an environment to provide a proper thermal coupling, and may be partially embedded in the encapsulant of the electronic component. Particularly on a surface of the electronic chip facing the thermal interface structure, heat dissipation of ohmic losses at the electronic chip during operation of the electronic component is rendered very efficiently by the thermal interface material (TIM). By selecting the material of the thermal interface structure to be not only thermally conductive but also electrically insulating, it is also possible to suppress or even eliminate creeping currents which might propagate into an interior of a package in a conventional approach.

In an embodiment, the electronic component further comprises a heat dissipation body attached or to be attached to the thermal interface structure for dissipating heat generated by the electronic chip during operation of the electronic component. Hence, also the optional attachment of a cooling body to an exterior surface of the thermal interface structure is possible by the architecture according to an exemplary embodiment. Such a heat dissipation body may have very different shapes. For example, it may be a plate of a properly thermally conductive body, such as copper or aluminium, which may have cooling fins or the like to further promote dissipation of heat which can be thermally conducted from the electronic chip via the mounting structure, the thermal interface structure to the heat dissipation body. The removal of the heat via the heat dissipation body may further be promoted by a cooling fluid such as air or water (more generally a gas and/or a liquid) which may flow along the heat dissipation body externally of the electronic component. In order to improve the mechanical coupling between the heat dissipation body and the thermal interface structure, it is also possible to use a fastening element, such as a screw or a clamp, in order to connect both constituents to one another. In a scenario, in which the thermal interface structure is a non-solid material having an adaptable shape and showing a compressibility (such as a paste or the like), this property of the material of the thermal interface structure efficiently promotes the thermal coupling between the thermal interface structure and the heat dissipation body. Alternatively, the thermal interface structure may have a solid shape. The mounting of the heat dissipation body to the electronic component may either be performed on a factory side, or may also be attached by a customer on a customer side. The described mounting technology and packaging technology is compatible with both concepts.

In an embodiment, the electrically conductive mounting structure and/or the thermal interface structure may be configured as or substantially as a sheet, a plate or a layer. Such a planar shape promotes the possibility to produce many electronic components at the same time by processing a corresponding batch-like arrangement which is then singularized into the individual electronic components.

In an embodiment, the electrically conductive mounting structure and the thermal interface structure together are configured as a Direct Copper Bonding (DCB) substrate. Such a DCB is available as a pre-manufactured standard component. Alternatively, also a Direct Aluminium Bonding (DAB) substrate may be used for this purpose. Particularly, a DCB substrate may be used which comprises a ceramic (or other material) layer directly below a copper layer. A DCB substrate provides a proper basis for an efficient removal of heat via a cooling structure which may be mounted directly on the DCB substrate. Also by the use of a DAB substrate this goal may be achieved. DCB and DAB substrates are commercially available and therefore allow for a cost efficient solution of the mounting and cooling issues. Also, such a DCP or DAB provides a proper basis for mounting one or more electronic chips even in a batch-like manner and has already advantageous provisions in terms of heat dissipation.

As an alternative to the use of such a DCB or DAB substrate, it is alternatively also possible to use a plate-like body of a thermally conductive and electrically insulating material as the thermal interface structure and to form an electrically conductive layer thereon, for instance by deposition, which then forms the mounting structure.

In an embodiment, the electronic chip is configured as a power semiconductor chip. Such a power semiconductor chip may be a chip which can be used for high power applications for instance in the field of automotive technology, domestic appliances, working tools, etc. Such a power semiconductor chip may have a semiconductor substrate having embedded therein at least one integrated circuit element such as a transistor (for instance a field effect transistor, for example a metal oxide semiconductor field effect transistor (MOSFET), or a bipolar transistor, for instance an insulated gate bipolar transistor (IGBT)), a diode, etc. Such a power semiconductor chip may have electrical contacts on both opposing main surfaces of the electronic chip, and may have a vertical current flow between the two opposing main surfaces.

In an embodiment, the redistribution structure may comprise a patterned electrically conductive layer. For instance, the patterned electrically conductive layer (or layers) may comprise one or more mounting platforms shaped and dimensioned for mounting one or more electronic chips thereon. The patterned electrically conductive layer (or layers) may also comprise a connection section for connecting the one or more mounting platforms to the periphery connection structure on one height level or basically on one height level. Such a redistribution structure is easy in manufacture (because it can be formed by a simple deposition and patterning procedure, for instance using a photolithography and etching procedure) and consumes only a very small amount of space since it can be formed as a thin layer on a common height level of the electronic component. Such a patterned electrically conductive layer may contribute—in particular in combination with the intermediate structure—to the redistribution of electric signals between the electronic chip(s) and the electric periphery.

In an embodiment, the periphery connection structure is configured as at least one electrically conductive leg (such as a strip), in particular a plurality of electrically conductive legs. Such electrically conductive legs may for instance form part of a leadframe and may therefore allow to provide for a standard connection exterior of the electronic component, while being mountable to the redistribution structure without the need of bond wires, for instance by welding or soldering. Thus, each of the legs may extend from an interior of the encapsulant, here directly contacting the redistribution structure, outside of the encapsulant so as to be pluggable into a plug-in position of a mounting board.

In an embodiment, each of the at least one leg has a first connection portion and an opposing second connection portion, the first connection portion being electrically connected directly to the redistribution structure and the second connection portion being configured for being plugged directly into the plug-in position of a board as the electronic periphery. Thus, the connection between the mounting board and the electronic component may be performed with a form closure at the second connection portion. In an embodiment, the connection at the first connection portion is a direct one without the need of a bond wire.

In an embodiment, the periphery connection structure and/or the mounting structure is configured as a leadframe. Thus, the electronic component according to an exemplary embodiment can be rendered compatible with standardized leadframe technology on a bottom side thereof and/or on a topside thereof. From the external appearance of the electronic component, it is not different from conventional electronic components which eases use of the electronic component for a user.

In an embodiment, the periphery connection structure and/or the mounting structure and/or the redistribution structure may be configured as a multi-layer structure, in particular formed by at least one dielectric layer and one or more electrically conductive inserts within the at least one dielectric layer. Therefore, it is possible to implement complex wiring architectures in particular within a multi-layer redistribution structure and/or a multi-layer mounting structure. For example, any desired coupling and/or decoupling between different ones of contact pads of the electronic chip(s) at an upper and/or a lower main surface thereof may be accomplished via the multi-layer mounting structure and/or multi-layer redistribution structure. In different planes, different contact pads on a bottom main surface and/or a top main surface of the electronic chips may be connected to one another or disconnected from one another. By vertical extensions through dielectric material located between multiple electronic chips of the electronic component between mounting structure and redistribution structure, coupling between top contact pads and bottom contact pads is possible as well.

In an embodiment, the encapsulant is formed only after having connected the thermal interface structure to the mounting structure. Therefore, the thermal interface structure can be already readily connected to the mounting structure before the encapsulation (for instance molding) procedure which reduces the risk of an undesired delamination of the thermal interconnect structure from the encapsulant material. This increases the reliability of the electronic component in terms of its electrical performance, and the formation of creeping currents is efficiently suppressed, hence the voltage breakthrough strength of the electronic component is improved.

In embodiments, the electronic component may be configured as a half bridge, a cascode circuit, a circuit constituted by a field effect transistor and a bipolar transistor being connected in parallel to one another, or a power semiconductor circuit. Therefore, the chip wiring according to exemplary embodiments is compatible with the requirements of very different circuit concepts.

In an embodiment, the electronic component further comprises a further electronic chip on the mounting structure, wherein the electrically conductive redistribution structure is arranged on the further electronic chip, and wherein the electronic chip is configured as a semiconductor power chip, in particular a field effect transistor or a bipolar transistor, and the further electronic chip is configured as a control chip, in particular a driver or a controller. Thus, the architecture according to exemplary embodiments allows the combination of one or more power semiconductor chips and one or more control chips in an electronic component without high power task requirements in one and the same electronic component. The multiple electronic chips may be arranged sidewise or laterally adjacent between the mounting structure and the redistribution structure.

In an embodiment, the electronic component further comprises a further electronic chip on the mounting structure, wherein the electrically conductive redistribution structure is arranged on the further electronic chip, and wherein the electronic chip, configured as a low side switch (LSS), and the further electronic chip, configured as a high side switch (HSS), are circuited as a half bridge circuit. A corresponding embodiment is shown in FIG. 9 to FIG. 11. Via double sided, chip-sandwiching multi-wiring structures of the mounting structure and of the redistribution structure, even a complex connection between the source terminals, drain terminals and gate terminals of these two transistor switches constituting the high side switch and the low side switch can be constituted. It is possible to arrange at least one of the high side switch and the low side switch upside down, i.e. in a flip-chip architecture.

In another embodiment, the electronic component further comprises a further electronic chip on the mounting structure, wherein the electrically conductive redistribution structure is arranged on the further electronic chip, and wherein the electronic chip, configured as a first transistor, in particular a field effect transistor, and the further electronic chip, configured as a second transistor, in particular a bipolar transistor, are circuited in parallel. Such an embodiment is shown in FIG. 12 and FIG. 13 and may be considered as a circuit combining a MOSFET (metal oxide semiconductor field effect transistor) and an IGBT (insulated gate bipolar transistor) for a high power semiconductor component. Again, at least one of the transistors may be arranged upside down, i.e. in accordance with a flip-chip architecture.

In an embodiment, the electronic component is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the electronic component according to an exemplary embodiment is fully compatible with standard packaging concepts (in particular fully compatible with standard TO packaging concepts) and appears externally as a conventional electronic component, which is highly user-convenient.

In an embodiment, the electronic component further comprises at least one of the group consisting of a thermal dissipation element and an electric element arranged on the redistribution structure. Such one or more thermal dissipation elements may be made of a thermally conductive material such as aluminum or copper and may serve as heat removal structures. The one or more electric elements may be elements such as at least one capacitance, at least one ohmic resistor, at least one inductance/coil. For instance, such an electric element may be a tuning capacitance. Such thermal dissipation elements and/or electric elements may also be embedded in the encapsulant and may be mounted on the redistribution structure, for instance on a patterned redistribution layer thereof.

In an embodiment, the method comprises forming the arrangement by connecting a plurality of interconnected electrically insulating and thermally conductive thermal interface structures to a plurality of interconnected electrically conductive mounting structures on the thermal interface structures, mounting a plurality of electronic chips, each of which being mounted on an assigned one of the mounting structures, and forming a plurality of interconnected electrically conductive redistribution structures, each of which being mounted on an assigned one of the electronic chips. Therefore, the described manufacturing architecture is highly compatible with a batch process, thereby allowing to efficiently manufacture many electronic devices in a parallel rather than executing a sequential procedure.

In an embodiment, the method further comprises singularizing the arrangement into the electronic component and at least one further electronic component after the forming of the encapsulant. Hence, encapsulation may also be performed efficiently on batch level. For the encapsulating, a plastic material or a ceramic material may be used. The singularization may be performed alternatively prior to the formation of the encapsulant. It may be performed by sawing, laser processing, etching, etc.

In an embodiment, the method further comprises electrically coupling a plurality of, in particular interconnected, periphery connection structures to the interconnected electrically conductive redistribution structures, wherein the plurality of periphery connection structures are configured for connection to the electronic periphery. Therefore, also the procedure of formation or connection of the periphery connection structures may be performed on a batch level, i.e. for multiple electronic components at the same time, forming part of one and the same arrangement.

In one embodiment, the electronic chips may be used as sensors or actuators in microelectromechanical systems (MEMS), for example as pressure sensors or acceleration sensors. In another embodiment, the electronic chips may be used as semiconductor chips for power applications for instance in the automotive field and may for instance have at least one integrated insulated-gate bipolar transistor (IGBT) and/or at least one integrated diode.

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 to FIG. 4 show different structures obtained during carrying out a method of manufacturing an electronic component according to an exemplary embodiment.

FIG. 6 to FIG. 8 show three-dimensional views of structures obtained during carrying out the method of manufacturing the electronic component according to FIG. 1 to FIG. 5 before and after encapsulation.

FIG. 12 shows a cross-sectional view of an electronic component according to another exemplary embodiment realizing a parallel circuitry of a MOSFET and an IGBT.

FIG. 13 shows a plan view of the electronic component of FIG. 12.

FIG. 14 to FIG. 18 show different cross-sectional views of arrangements according to exemplary embodiments obtained during carrying out a method of manufacturing a plurality of electronic components in a batch process.

FIG. 19 shows an electronic component according to an exemplary embodiment obtained from singularizing the arrangement of FIG. 18.

FIG. 20 shows the electronic component of FIG. 19 after encapsulating.

DETAILED DESCRIPTION

Figure 5:
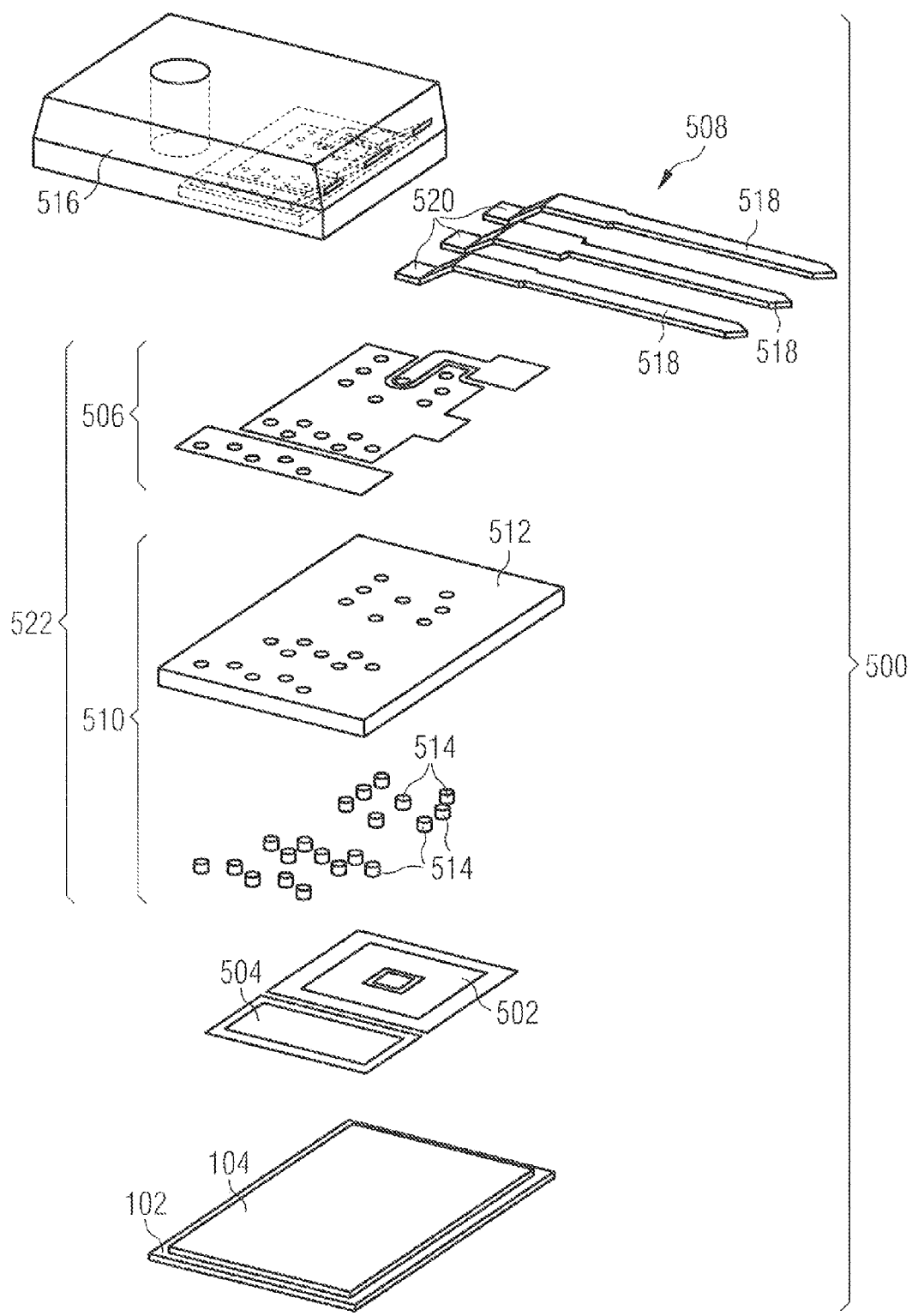
FIG. 5 shows an explosive view of an electronic component manufactured in accordance with an exemplary embodiment implementing the procedures illustrated referring to FIG. 1 to FIG. 4.

The illustration in the drawing is schematically and not to scale.

According to one embodiment, a submount-based TO package (or any leadframe-based package, which may be double sided exposed for double sided cooling) with a high voltage breakthrough strength and an efficient heat removal performance is provided.

During operation of a TO component, an electronic chip may be heated due to losses up to high temperatures of 150° and more ("T-junction"). This heat shall be removed out of the casing in order to prevent local overheating and resulting failure of the electronic component. In addition, such electronic devices, particularly when used for high power applications, require a reliably high voltage breakthrough strength (for instance up to 10 kV). For these requirements, a proper trade-off is desired.

Conventionally, thermal interface structures can be used which are made of an electrically insulating and thermally conductive material which may be filled with particularly appropriate filling materials to optimize desired properties. The coupling of such a thermal interface material (TIM), for instance specially configured ceramics, onto a copper carrier during mounting is difficult, since such a connection forms a heat conduction barrier.

Another conventional solution is a so-called FullPAK casing which however has some limitations concerning performance in terms of heat removal by heat transfer to a cooling body outside of the component. In such FullPAK casings, the heat transfer is performed basically by the encapsulant which has a limited thermal conductivity.

In order to overcome conventional limitations, an exemplary embodiment provides a thermally conductive and electrically insulating thermal interface structure which can be attached, outside of the actual mounting procedure, in a high volume before mounting electronic chips on a mounting structure such as a copper carrier. Thus, the freedom of specifically selecting functional materials for the thermal interface structure can be increased, for instance in terms of higher filling percentages. Moreover, an improved adhesion of the thermally conductive material at the copper carrier is possible by an appropriate material selection. It is for instance possible to laminate or galvanically grow the mounting structure on the thermal interface structure. Such a process for manufacturing sub-modules for electronic components can be performed on a batch level, i.e. for manufacturing a large number of electronic components in parallel. Alternatively, it is also possible to implement a Direct Copper Bonding (DCB) substrate as chip carrier providing a combination of thermal interface structure and mounting structure.

Such a concept may also allow to omit traditional wire bonding for contacting fingers of a leadframe to an upper surface of the electronic chip. Thus, a chip embedding technology may be implemented in which the panel scale can be improved in terms of manufacturing efficiency.

Such an architecture has the advantage of an increase of the performance of a TO (Thin Outline) housing due to an improved thermal conductivity while simultaneously increasing the voltage breakthrough strength. It is also possible to increase the cooling via an upper side of the electronic component due to a full surface coupling (via a redistribution structure) of the electronic chip, rather than only having a thin wire connection. Furthermore, the involved inductance can be reduced. The reliability of the electrical performance of the electronic component may be increased by increased creeping distances in the design. Thus, the propagation length of a creeping current from an exterior of the electronic component to the mounting structure and the electronic chip may be increased by a suitable configuration of the thermal interface structure. The freedom of design is increased independently of the requirements of the wiring technology, and the potential of miniaturizing is furthermore improved. The latter advantage can be achieved by a shrinkage of the sub-module. This holds independently of the geometry of the external housing. At the same time, no adaptation of the dimension of the housing is necessary, which increases the user convenience. Due to the proper electrical performance, the range of possible applications (in particular of current/voltage values) is extended. It is also possible to manufacture the electronic devices with reasonable effort. No specific manufacturing apparatus need to be developed, since well-known procedures of chip embedding technologies may be synergetically combined. The electrical isolation of the interior of the electronic component may be improved, and the temperature robustness at the chip can be improved by the opportunity to use freely selectively material for the thermal interface structure. Moreover, it is possible to singularize by sawing at the position of the thermal interface structure. The cooling in an upward direction can be improved by a heat dissipation body connected to a leadframe (dual gage leadframe). This can be accomplished by a clip or solder connection with a specific leadframe design. By such a corresponding leadframe design, current peaks can be suppressed (for instance when switching the electronic component on). It is furthermore possible to use the described architecture to integrate further active and/or passive components (such as inductance, capacitance, sensors, etc.).

Thus, exemplary embodiments allow to improve the performance of the electronic component and the reliability. This can be accomplished by an improved heat dissipation towards a heat dissipation body or cooling body and may reduce inductance of the electronic component.

According to the described aspect, a sub-module may be provided using a laminate and embedding technology. It is possible to use materials having a proper thermal conductivity and a proper electrical insulating property and which are conventionally not easily implementable in a mold procedure. It is furthermore possible to configure a corresponding electronic component in accordance with conventional leadframe housings (such as TO 220, TO 247, etc.).

According to another aspect, an above-described sub-module with one or more chips being sandwiched with a full coverage of their main surfaces by a planar mounting structure and a planar redistribution structure may be used (with or without thermal interface structure) for forming a multi-chip circuit. The mounting structure and/or the redistribution structure may here be configured as a dielectric matrix having multiple electrically conductive inserts embedded therein. This allows to improve the reliability and the freedom of design in multi-chip mounting in a semiconductor power housing.

FIG. 1 shows a three-dimensional view of a structure 100 used for as a basis for carrying out a method of manufacturing an electronic component 500 shown in FIG. 5.

The structure 100 comprises a thermal interface structure 102 being electrically insulating and thermally conductive. For example, the thermal interface structure 102 may comprise or consist of a ceramic material, and may have filler particles to promote the thermal conductivity while suppressing electrical conductivity. An electrically conductive layer is formed on the thermal interface structure 102 and constitutes a mounting structure 104 which is subsequently used for mounting electronic chips. The structure 100 can be formed for a batch process, i.e. it is possible to form structure 100 in a dimension enabling to mount multiple electronic chips in a parallel process thereon. The thermal interface structure 102 can be formed by using specifically filled resins (for instance filled with BN, AlN and/or SiN). The mounting structure 104 can be a patterned copper layer.

FIG. 2 shows a cross-sectional view 200 of the structure 100 shown in FIG. 1. FIG. 2 furthermore illustrates schematically that a heat dissipation body 202 may be attached to an external surface of the thermal interface structure 102 for dissipating heat generated by the electronic chip during operation of the electronic component, when the latter has been readily manufactured. It should however be said that the heat dissipation body 202 is usually only attached to the thermal interface structure 102 when the electronic component is readily manufactured. FIG. 2 shall only indicate schematically the way of mounting the heat dissipation body 202 with respect to the thermal interface structure 102.

FIG. 3 shows a structure 300 obtained upon mounting an electronic chip 502 and a further electronic chip 504 on the structure 100 shown in FIG. 1. The electronic chips 502, 504 may be soldered onto the mounting structure 104. Thereafter, a patterned electrically conductive layer constituting a redistribution layer 506 is mounted on the electronic chips 502, 504. As can be taken from FIG. 5 only, it is possible to sandwich an intermediate structure 510 between the electronic chips 502, 504 on the one hand and the redistribution layer 506 on the other hand. Together, the redistribution layer 506 and the intermediate structure 510 (which will be described in further detail referring to FIG. 5) form an electrically conductive redistribution structure 522, see FIG. 5. The electronic chip 502 and the further electronic chip 504 may together provide the function of a switch with a free-wheeling diode.

In FIG. 4, showing a structure 400, this intermediate structure 510 is visible.

FIG. 5 shows an explosive view of an electronic component 500 manufactured in accordance with an exemplary embodiment implementing the procedure shown in FIG. 1 to FIG. 4.

In particular, FIG. 5 shows that the intermediate structure 510 is formed by a sheet-like dielectric matrix 512 (which can be formed by molding) having a plurality of through-holes filled with electrically conductive material to thereby constitute inserts 514. As an alternative to the implementation of the intermediate structure 510 by molding, it can also be formed by laminating. The inserts 514 are capable of electrically connecting corresponding contact pads of the electronic chips 502, 504 with corresponding contact structures of the redistribution layer 506. As an alternative to the configuration of the intermediate structure 510 shown in FIG. 5, it is for instance also possible to sandwich an arrangement of bumps of electrically conductive material embedded in a dielectric surrounding in between the redistribution layer 506 and the electronic chips 502, 504. As indicated in FIG. 5, the redistribution structure 522 is formed by the combination of the redistribution layer 506 and the intermediate structure 510.

As can furthermore be taken from FIG. 5, an upper surface of the redistribution structure 522 (which redistributes electric signals propagating between the electronic chips 502, 504 and an electronic periphery) is electrically connected (for instance by welding, soldering, or gluing) with electrically conductive portions (such as fingers, a lead finger, a lead, an out-lead, etc.) of a leadframe constituting a periphery connection structure 508. In the shown embodiment, the periphery connection structure 508 comprises three pins or legs for operating the switch with connected free-wheeling diode provided by the electronic chip 502 in combination with the further electronic chip 504. More precisely, first connection portions 520 of the periphery connection structure 508 are to be directly connected to an upper surface of the redistribution layer 506, whereas second connection portions 518 of the periphery connection structure 508 may be soldered onto a printed circuit board (not shown) or may be used as plug-in contacts to be plugged in plug-in positions of a mounting board (not shown) so that the electronic component 500 (which may also be denoted as package) can be electrically and mechanically connected to such a mounting board such as a printed circuit board. The redistribution structure 522 with its intermediate structure 510 is highly advantageous because it allows the selective electric coupling or decoupling of different contact pads of the different electronic chips 502, 504 and between different contact pads of one electronic chip 502 or 504.

As indicated schematically in FIG. 5 as well, the described constituents of the electronic component 500 can then be encapsulated by an encapsulant 516 which can be formed by molding, for example. After this encapsulation, all constituents are fully embedded within the encapsulant 516 with the exception of the second connection portions 518 extending beyond the encapsulant 516 and with the exception of a lower surface of the thermal interface structure 102 forming a bottom surface of the electronic component 500.

Still referring to FIG. 5, all procedures can be performed as a batch procedure, i.e. for multiple electronic components 500 together, up to (and preferably including) the welding of the periphery connection structure 508. After that, the batch arrangement may be singularized.

The redistribution structure 522 substitutes a conventional wire bonding and thereby significantly simplifies the procedure and increases the thermal coupling of the electronic chips 502, 504 to thereby remove heat generated during operation of the electronic component 500. The through-holes in the matrix 512 filled by electrically conductive inserts 514 as vias can be formed by laser processing. The electronic chips 502, 504 are thin dies which have contacts on the top main surface as well as on the bottom main surface and can therefore allow for a vertical current flow (as it is advantageous for power application chips).

The provision of the structure 100 as a basis for forming the electronic component 500 gives a high freedom of design concerning manufacturing conditions (such as temperature and pressure) as well as material selection. An upper surface of the copper layer forming the mounting structure 104 can be roughened in order to promote a good adhesion of the electronic chips 502, 504 mounted thereon. A bottom surface of the thermal interconnect structure 102 can be connected to a cooling body 202, as indicated schematically in FIG. 2. The mounting of this cooling body can be accomplished after the electronic component 500 is readily manufactured.

FIG. 6 shows a three-dimensional view of a structure 600 obtained during manufacturing the electronic component 500 shown in FIG. 5 before encapsulation.

FIG. 7 shows the structure 600 after applying the material of the encapsulant 516, thereby showing a three-dimensional view of the electronic component 500 (but illustrating the interior thereof).

FIG. 8 shows an external view of the electronic component 500 (without illustrating the interior thereof) and an electronic periphery 501.

Figure 9:
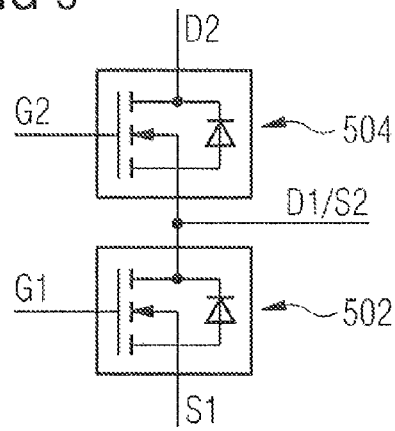
FIG. 9 shows a circuitry of a half-bridge.

FIG. 9 shows an electric circuitry of a low side switch (LSS) as an electronic chip 502 and a high side switch (HSS) as further electronic chip 504, both electronic chips 502, 504 being configured as a corresponding MOSFET and being circuited so as to form a half-bridge circuit. What concerns the first electronic chip 502, its source terminal is denoted as S1, its drain terminal is denoted as D1, and its gate terminal is denoted as G1. What concerns the second electronic chip 504, its source terminal as denoted as S2, its drain terminal is denoted as D2, and its gate terminal is denoted as G2.

Figure 10:
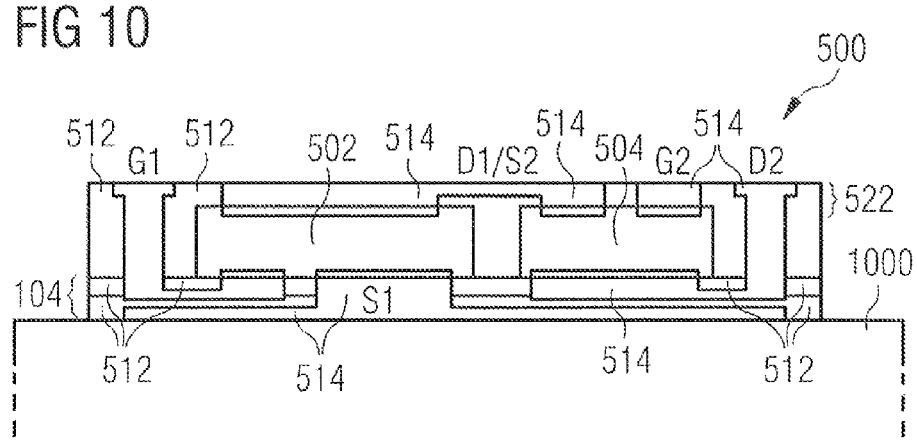
FIG. 10 shows a cross-sectional view of an electronic component according to an exemplary embodiment providing the half-bridge function according to FIG. 9.
Figure 11:
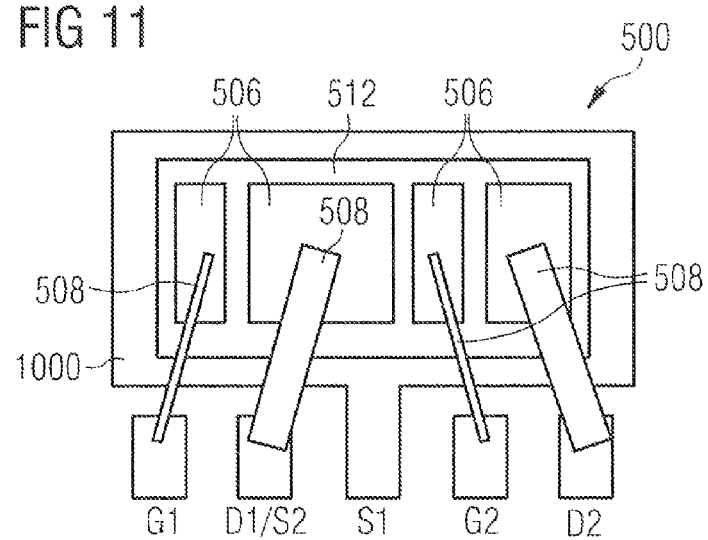
FIG. 11 shows a plan view of the electronic component of FIG. 10.

FIG. 10 shows a cross-sectional view and FIG. 11 shows a plan view of an electronic component 500 according to an exemplary embodiment implementing the circuitry of FIG. 9. More specifically, FIG. 10 shows a multi-chip configuration, and FIG. 11 indicates a bond diagram in TO 247-5 technology for the multi-chip.

As indicated schematically in FIG. 10, the electronic component 500 further comprises an electrically conductive carrier structure 1000, here configured as a leadframe, on which the electrically conductive mounting structure 104 is directly arranged (in this embodiment without a thermal interface structure 102). On top of the electronic chips 502, 504 an electrically conductive redistribution structure 522 is provided to contact the electronic chips 502, 504 from a top side. Hence, the basis of the electronic component 500 is again a sub-module architecture as described above. While the further electronic chip 504 is arranged with its source connection S2 at the top side, the electronic chip 502 is arranged in a flip chip arrangement with its source connection S1 at the bottom side. In the shown embodiment, both the mounting structure 104 and the redistribution structure 522 are formed with a dielectric matrix 512 with electrically conductive inserts 514 embedded therein. What concerns the mounting structure 104, this is accomplished by a multi-layer structure of two connected planar electrically insulating layers with horizontally aligned and vertically aligned electrically conductive portions embedded therein. What concerns the redistribution structure 522, this is accomplished by an encapsulant material forming the dielectric matrix 512 having electrically conductive inserts 514 in recesses thereof. A connection structure for G1 extends on the left-hand side of FIG. 10 at a lateral side of the electronic chips 502, 504 vertically through the dielectric matrix 512. Correspondingly, a connection structure for D2 extends on the right-hand side of FIG. 10 at a lateral side of the electronic chips 502, 504 vertically through the dielectric matrix 512. The source-down arrangement, what concerns S1, shown in FIG. 10 results in a proper electronic performance, since the source terminal S1 can be directly attached to the electrically conductive carrier structure 1000. Since its electric potential may be low, no electric isolation is required there.

As can specifically be taken from FIG. 11, an upper surface of the redistribution structure 522 can be denoted as a patterned redistribution layer 506 connected via wire bonds, which in this embodiment constitute periphery connection structure 508, to contact pads (such as fingers, a lead finger, a lead, an out-lead, etc.) of the electrically conductive carrier structure 1000 (a leadframe).

FIG. 12 shows a cross-sectional view and FIG. 13 shows a plan view of an electronic component 500 according to another exemplary embodiment implementing a MOSFET as first electronic chip 502 and an IGBT as second electronic chip 504, wherein the MOSFET is circuited in parallel to the IGBT. Again, G1 and G2 indicate gate terminals, D indicates a drain terminal, S indicates a source terminal, E indicates an emitter terminal and C indicates a collector terminal. Again, inter-chip connections are constituted by multi-layer compositions of the mounting structure 104 and the redistribution structure 522, in a similar way as described above referring to FIG. 10 and FIG. 11.

In the following, referring to FIG. 14 to FIG. 20, a method of manufacturing a plurality of electronic chips 500 in a batch process according to an exemplary embodiment will be explained.

Figure 14:
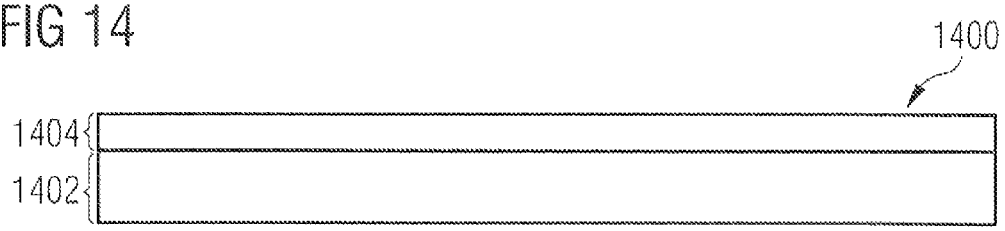

FIG. 14 shows a structure 1400 formed of a plurality of interconnected thermal interface structures 1402 (each defined by a section of the lower layer of FIG. 14) on which a plurality of interconnected mounting structures 1404 (each defined by a section of the upper layer of FIG. 14) are mounted. The structure 1400 forms the basis for a process of producing a plurality of electronic components 500 in a batch process.

Figure 15:
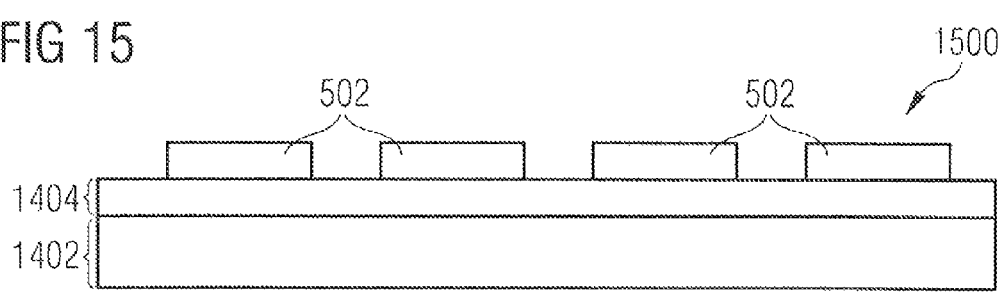

In order to obtain structure 1500 shown in FIG. 15, a plurality of electronic chips 502 are mounted on the plurality of mounting structures 1404, i.e. one electronic chip 502 per thermal interface structure 1402 and assigned mounting structure 1404.

Figure 16:
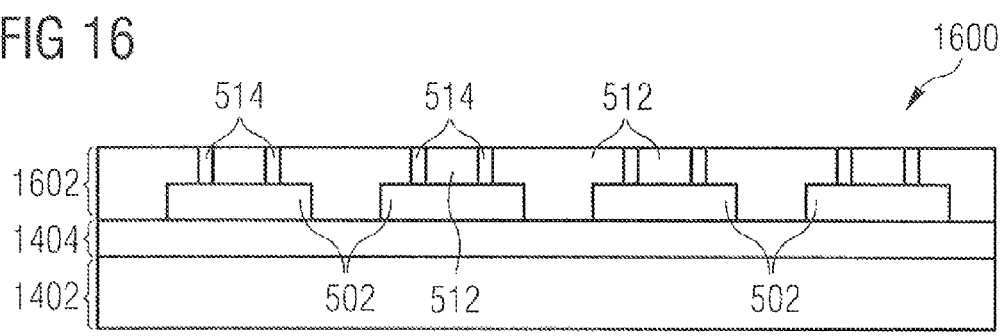

In order to obtain structure 1600 shown in FIG. 16, a plurality of intermediate structures 1602 (each defined by a section of the uppermost portion of FIG. 16) are formed with a dielectric matrix 512 in which a plurality of electrically conductive inserts 514, here configured as vias, are embedded.

Figure 17:
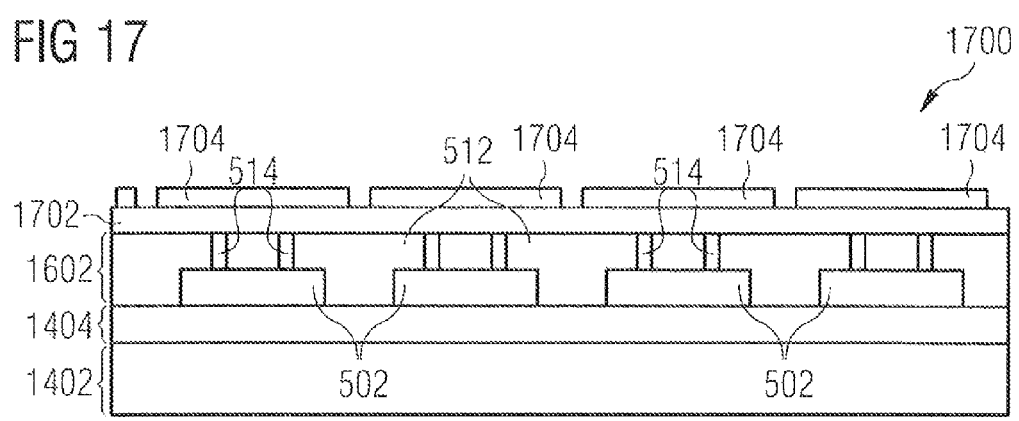

In order to obtain structure 1700 shown in FIG. 17, an electrically conductive layer 1702 of metallic material is deposited on the structure 1600, followed by the deposition of a photoresist mask 1704.

In order to obtain structure 1800 shown in FIG. 18, structure 1700 is made subject of an etching procedure, wherein the photoresist 1704 serves as an etch mask. Consequently, a plurality of patterned redistribution layers 1802 (each defined by a section of the uppermost portion of FIG. 18) are formed on the interconnected intermediate structures 1602. The photoresist 1704 is then removed.

As can furthermore be taken from dotted vertical lines in FIG. 18, the arrangement 1800 is then singularized into a plurality of electronic components 500. Each pair of intermediate structure 1602 and patterned redistribution layer 1802 forms a redistribution structure 522 of a respective electronic chip 502.

As can be taken from FIG. 19, it is possible to connect a periphery connection structure 508 (here embodied as a leadframe) to the individual electronic components 500, wherein a direct soldering or gluing connection between the bottom of the periphery connection structure 508 and the top of the redistribution structure 522 is formed.

In order to obtain packaged electronic component 500 shown in FIG. 20, the electronic component 500 shown in FIG. 19 is made subject of an encapsulation procedure to thereby form encapsulant 516. Furthermore, the thermal interface structure 102 may be connected to a heat dissipation body 202 as a cooling body.

As can be taken from FIG. 19 and FIG. 20, the formation of the periphery connection structure 508 as well as the formation of the encapsulant 516 is performed for each electronic component 500 individually. However, as can be taken from FIG. 21 and FIG. 22, one or both of these procedures may also be performed on a batch level.

Figure 21:
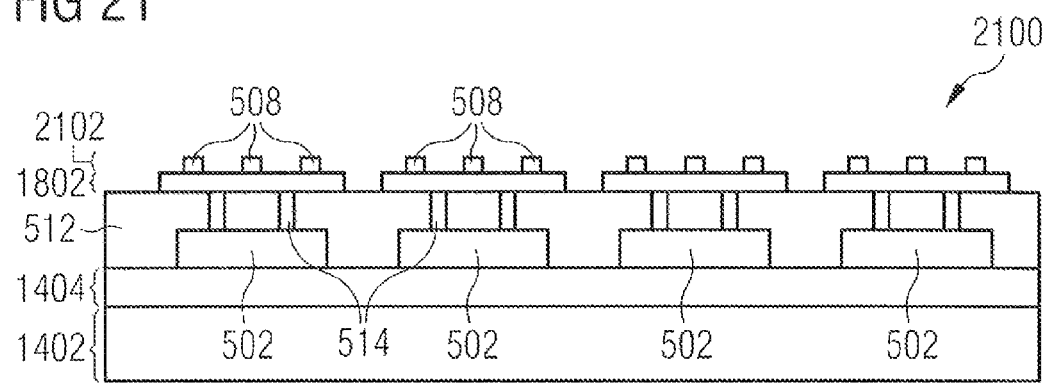
FIG. 21 and FIG. 22 show cross-sectional views of arrangements according to another exemplary embodiment in which formation of periphery connection structures and encapsulation is performed in a batch process.

As can be taken from arrangement 2100 shown in FIG. 21, it is possible to connect the fingers of the leadframe constituting the respective periphery connection structures 508 to the redistribution structures 1802, thereby forming a plurality of interconnected periphery connection structures 2102 (each defined by a section of the uppermost portion of FIG. 21).

Figure 22:
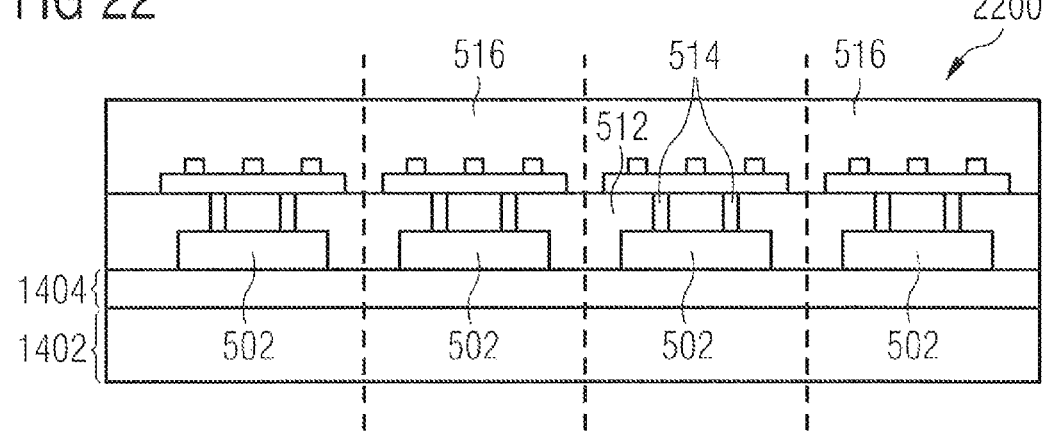

As can be taken from FIG. 22, an arrangement 2200 is obtained by depositing encapsulant 516 on top of the arrangement 2100 of FIG. 21. As indicated by vertical dotted lines in FIG. 22, the arrangement 2200 may then be singularized to form the individual electronic components 500.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic component, the electronic component comprising:
   an electrically conductive mounting structure;
   an electrically conductive carrier structure, on which the electrically conductive mounting structure is arranged;
   an electronic chip on the mounting structure;
   an electrically conductive redistribution structure on the electronic chip;
   a periphery connection structure electrically coupled to the redistribution structure and being configured for connecting the electronic component to an electronic periphery;
   the mounting structure being a contract structure such that the electronic chip is double sided electrically coupled via the mounting structure on the one side and the redistribution structure on the other side;
   wherein the periphery connection structure is configured as at least one electrically conductive leg, in particular a plurality of electrically conductive legs and
   wherein each of the at least one leg has a first connection portion and an opposing second connection portion, the first connection portion being electrically connected to the redistribution structure, and the second connection portion being configured for being plugged into a plug-in position of a board as the electronic periphery.

2. The electronic component according to claim 1, wherein at least one of the electrically conductive mounting structure and the electrically conductive redistribution structure comprises electrically conductive inserts in an electrically insulating matrix.

3. The electronic component according to claim 1, wherein at least one of the electrically conductive mounting structure and the electrically conductive redistribution structure is shaped as a planar structure completely covering a respective main surface of the electronic chip.

4. The electronic component according to claim 1, wherein at least one of the electrically conductive mounting structure and the electrically conductive redistribution structure is configured as a multi-layer structure.

5. The electronic component according to claim 2, wherein at least one of the group consisting of the redistribution structure and the mounting structure comprises a patterned redistribution layer and an intermediate structure arranged between the electronic chip and the redistribution layer, wherein the intermediate structure includes the electrically insulating matrix and the electrically conductive inserts in the matrix for electrically coupling at least one contact pad of the electronic chip with the redistribution layer.

6. The electronic component according to claim 2, wherein different ones of the electrically conductive inserts are electrically coupled to different ones of contact pads of the electronic chip, wherein the electrically insulating matrix electrically decouples the different contact pads from one another.

7. The electronic component according to claim 2, wherein the electronic component comprises a further electronic chip, wherein at least one of the electrically conductive inserts is electrically coupled to the electronic chip, and at least one other of the electrically conductive inserts is electrically coupled to the further electronic chip.

8. The electronic component according to claim 1, wherein the electronic component further comprises an encapsulant at least encapsulating the electronic chip, the redistribution structure, the mounting structure and part of the periphery connection structure.

9. The electronic component according to claim 8, wherein part of the periphery connection structure, and optionally part of an electrically insulating and thermally conductive thermal interface structure or an electrically conductive carrier structure on which the electrically conductive mounting structure is mounted, extend beyond the encapsulant to maintain exposed to an environment.

10. The electronic component according to claim 1, wherein the electronic component further comprises an electrically conductive carrier structure, in particular a leadframe, on which the electrically conductive mounting structure is arranged.

11. The electronic component according to claim 1, wherein the electronic component further comprises at least one electrically insulating and thermally conductive thermal interface structure.

12. The electronic component according to claim 11, wherein the electronic component further comprises a heat dissipation body attached or to be attached to the thermal interface structure for dissipating heat generated by the electronic chip during operation of the electronic component.

13. The electronic component according to claim 1, wherein the electronic chip is configured as a power semiconductor chip.

14. The electronic component according to claim 1, wherein the electronic component is configured as one of the group consisting of a half bridge, a cascode circuit, a circuit constituted by a field effect transistor and a bipolar transistor being connected in parallel to one another, and a power semiconductor circuit.

15. The electronic component according to claim 1, wherein the electronic component further comprises a further electronic chip on the mounting structure, wherein the electrically conductive redistribution structure is arranged on the further electronic chip, wherein the electronic chip is configured as a semiconductor power chip, in particular a field effect transistor or a bipolar transistor, and wherein the further electronic chip is configured as a control chip, in particular a driver or a controller.

16. The electronic component according to claim 1, wherein the electronic component further comprises a further electronic chip on the mounting structure, wherein the electrically conductive redistribution structure is arranged on the further electronic chip, and wherein the electronic chip, configured as a low side switch, and the further electronic chip, configured as a high side switch, are circuited as a half bridge circuit.

17. The electronic component according to claim 1, wherein the electronic component further comprises a further electronic chip on the mounting structure, wherein the electrically conductive redistribution structure is arranged on the further electronic chip, and wherein the electronic chip, configured as a first transistor, in particular a field effect transistor, and the further electronic chip, configured as a second transistor, in particular a bipolar transistor, are circuited in parallel.

18. The electronic component according to claim 1, configured as one the group consisting of a leadframe connected power module, a Transistor Outline electronic component, a Quad Flat No Leads Package electronic component, a Small Outline electronic component, a Small Outline transistor electronic component, and a Thin More Outline Package electronic component.

19. The electronic component according to claim 1, further comprising at least one of the group consisting of a thermal dissipation element and an electric element arranged on the redistribution structure.

20. A method of manufacturing an electronic component, the method comprising:
arranging an electrically conductive mounting structure on an electrically conductive carrier structure:
mounting an electronic chip on an the electrically conductive mounting structure;
arranging an electrically conductive redistribution structure on the electronic chip;
electrically coupling a periphery connection structure to the redistribution structure and configuring the periphery connection structure for connecting the electronic component to an electronic periphery;
configuring at least one of the electrically conductive mounting structure and the electrically conductive redistribution structure with electrically conductive inserts in an electrically insulating matrix
the mounting structure being a contract structure such that the electronic chip is double sided electrically coupled via the mounting structure on the one side and the redistribution structure on the other side:
wherein the periphery connection structure is configured as at least one electrically conductive leg, in particular a plurality of electrically conductive legs and and
wherein each of the at least one leg has a first connection portion and an opposing second connection portion, the first connection portion being electrically connected to the redistribution structure, and the second connection portion being configured for being plugged into a plug-in position of a board as the electronic periphery.

21. The method according to claim 20, wherein the method further comprises connecting an electrically insulating and thermally conductive thermal interface structure to the electrically conductive mounting structure.

22. The method according to claim 20, wherein the method further comprises forming an encapsulant at least encapsulating the electronic chip, the redistribution structure, the mounting structure and part of the periphery connection structure.

23. The method according to claim 20, wherein the method comprises forming an arrangement by:
connecting a plurality of interconnected electrically insulating and thermally conductive thermal interface structures to a plurality of interconnected electrically conductive mounting structures;
mounting a plurality of electronic chips, each of which being mounted on an assigned one of the mounting structures;
forming a plurality of interconnected electrically conductive redistribution structures, each of which being mounted on an assigned one of the electronic chips.

24. The method according to claim 23, wherein the method further comprises singularizing the arrangement into the electronic component and at least one further electronic component after the forming.

25. The method according to claim 20, wherein the method further comprises forming the redistribution structure with a redistribution layer and an intermediate structure between the electronic chip and the redistribution layer, the intermediate structure having the electrically insulating matrix and the electrically conductive inserts in the matrix for electrically coupling a contact pad of the electronic chip with the redistribution layer.

26. The method according to claim 20, wherein the method further comprises electrically coupling a plurality of, in particular interconnected, periphery connection structures to the interconnected electrically conductive redistribution structures, wherein the plurality of periphery connection structures are configured for connection to an electronic periphery.

* * * * *